United States Patent
Tu et al.

(10) Patent No.: US 10,642,363 B1
(45) Date of Patent: May 5, 2020

(54) TACTILE FEEDBACK MODULE, METHOD FOR MAKING SAME, AND TOUCH DEVICE

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Yu-Chieh Tu, Zhunan (TW); Yi-Ting Wu, Zhunan (TW)

(73) Assignees: Interface Technology (ChenDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 0 days.

(21) Appl. No.: 16/369,065

(22) Filed: Mar. 29, 2019

(30) Foreign Application Priority Data

Jan. 11, 2019 (CN) .......................... 2019 1 0026457

(51) Int. Cl.
*G06F 3/01* (2006.01)
*G06F 3/041* (2006.01)

(52) U.S. Cl.
CPC ............ *G06F 3/016* (2013.01); *G06F 3/0416* (2013.01)

(58) Field of Classification Search
CPC ..... G06F 3/016; G06F 3/0416; G06F 3/04164
See application file for complete search history.

(56) References Cited

U.S. PATENT DOCUMENTS

| | | | |
|---|---|---|---|
| 2011/0156539 A1* | 6/2011 | Park | H01L 41/083 310/366 |
| 2013/0187723 A1* | 7/2013 | Harima | H03B 5/36 331/158 |
| 2015/0298173 A1* | 10/2015 | Bibl | H01L 41/098 310/334 |
| 2016/0209922 A1* | 7/2016 | Kim | G06F 3/016 |
| 2018/0081441 A1* | 3/2018 | Pedder | G06F 3/016 |
| 2019/0107897 A1* | 4/2019 | Ou | H01L 41/319 |
| 2019/0238995 A1* | 8/2019 | Fukuyama | H04R 1/00 |
| 2019/0265793 A1* | 8/2019 | Costante | G06F 3/041 |
| 2019/0317604 A1* | 10/2019 | Khoshkava | G06F 3/0414 |
| 2019/0361531 A1* | 11/2019 | Choi | H01L 41/193 |

* cited by examiner

*Primary Examiner* — Premal R Patel
(74) *Attorney, Agent, or Firm* — ScienBiziP, P.C.

(57) ABSTRACT

A tactile feedback module not subject to a failure in function because of high-voltage arcing includes a circuit board and a piezoelectric unit. The circuit board includes spaced first connecting pad and second connecting pad. The piezoelectric unit includes a piezoelectric layer, a first electrode, and a second electrode. The piezoelectric layer is adjacent to the circuit board, and the first electrode and the second electrode are insulated from each other. A first voltage is applied to the first electrode and a second voltage different from the first voltage is applied to the second electrode, the piezoelectric layer generates a tactile feedback based on a voltage difference between the voltages. The disclosure also provides a method for making the tactile feedback module and a touch device.

15 Claims, 12 Drawing Sheets

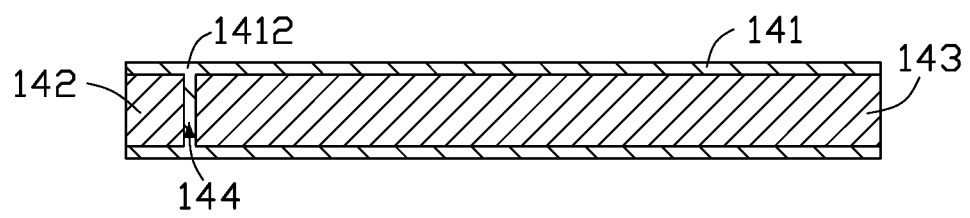
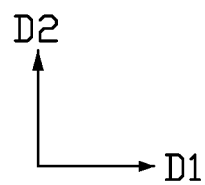
FIG. 3 providing a circuit board, wherein the circuit board comprises a first connecting pad and a second connecting pad spaced apart from the first connecting pad, and an uncured film-type isotropic conductive adhesive is formed on the first connecting pad and the second connecting pad — S1 providing a piezoelectric unit and laminating the piezoelectric unit to the circuit board, wherein the piezoelectric unit includes a piezoelectric layer, a first electrode and a second electrode, the piezoelectric layer has a first surface, a second surface opposite to the first surface and a side surface connecting the first surface and the second surface, the first electrode extends from the second surface of the piezoelectric layer along the side surface of the piezoelectric layer to the first surface of the piezoelectric layer, and the second electrode is at least on the first surface of the piezoelectric layer and spaced apart from the first electrode — S2 curing the film-type isotropic conductive adhesive to form a first isotropic conductive adhesive layer and a second isotropic conductive adhesive layer, wherein the first electrode is electrically connected to the first connecting pad by the first isotropic conductive adhesive layer, and the second electrode is electrically connected to the second connecting pad by the second isotropic conductive adhesive layer — S3

TACTILE FEEDBACK MODULE, METHOD FOR MAKING SAME, AND TOUCH DEVICE

FIELD

The subject matter herein generally relates to haptic communication.

BACKGROUND

A tactile feedback module generally includes a piezoelectric unit and a circuit board electrically connected to the piezoelectric unit. However, in a reliability analysis (RA) test, when a high voltage is applied to a piezoelectric device, there may be arcing at electrical connections between the piezoelectric unit and the circuit board, resulting in no tactile feedback.

Therefore, there is room for improvement in the art.

BRIEF DESCRIPTION OF THE DRAWINGS

Implementations of the present disclosure will now be described, by way of embodiment, with reference to the attached figures.

FIG. 3 is a top planar view of a piezoelectric unit in the module of FIG. 2.

FIG. 7 is a flow chart of a method for making the tactile feedback module shown in FIG. 2.

DETAILED DESCRIPTION

Figure 1:
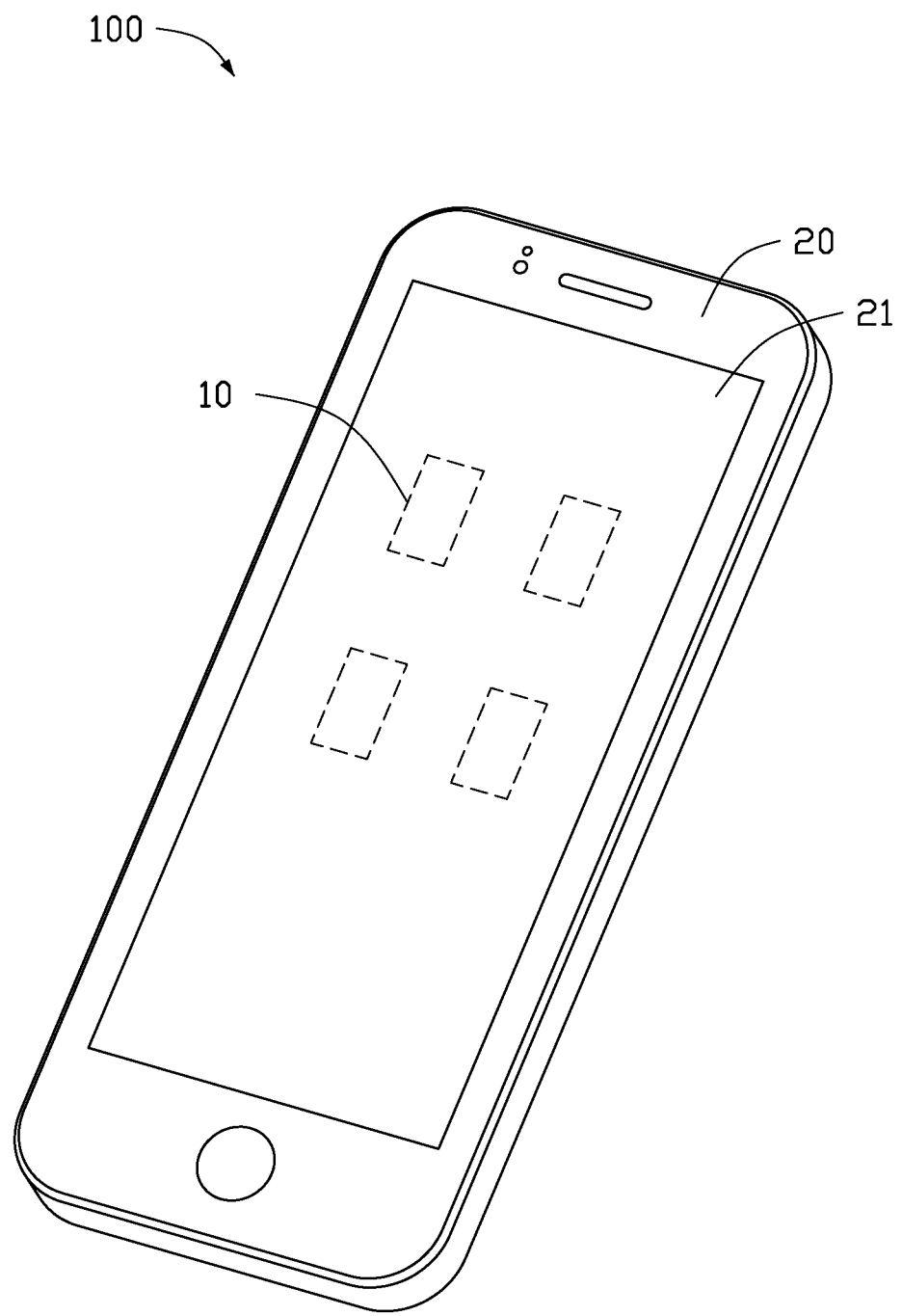
FIG. 1 is a planar view showing a touch device according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one." The term "circuit" is defined as an integrated circuit (IC) with a plurality of electric elements, such as capacitors, resistors, amplifiers, and the like.

Referring to FIG. 1, a touch device 100 includes a cover 20 and a plurality of tactile feedback modules 10. The cover 20 defines a touch surface 21 for inputting touch operations. The tactile feedback modules 10 are on a side of the cover 20 away from the touch surface 21. The touch device 100 may be a mobile phone, a tablet computer, a smart wearable device (such as a smart watch), and the like.

Figure 2:
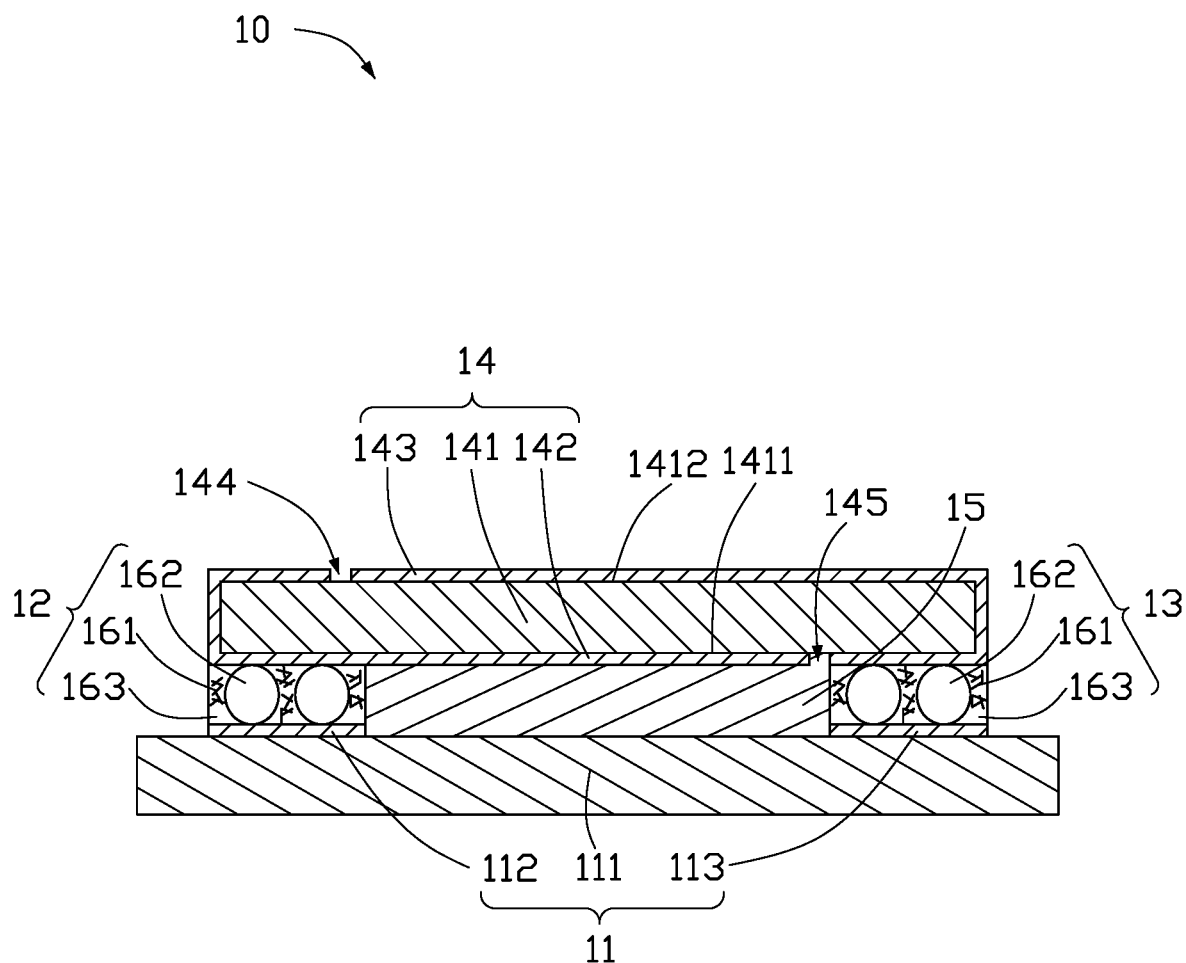
FIG. 2 is a cross-sectional view of a tactile feedback module in the device of FIG. 1.

Referring to FIG. 2, the tactile feedback module 10 includes a circuit board 11, an isotropic conductive film (ICF 12), an isotropic conductive adhesive layer (ICAL 13), a piezoelectric unit 14, and an insulating layer 15.

The circuit board 11 includes a substrate 111, a first connecting pad 112, and a second connecting pad 113. The first connecting pad 112 and the second connecting pad 113 are on a surface of the substrate 111, and the first connecting pad 112 and the second connecting pad 113 are spaced apart from each other.

The ICF 12 is on a surface of the first connecting pad 112 opposite to the substrate 111. The ICAL 13 is on a surface of the second connecting pad 113 opposite to the substrate 111.

The piezoelectric unit 14 includes a piezoelectric layer 141, a first electrode 142, and a second electrode 143. The piezoelectric layer 141 has a first surface 1411, a second surface 1412 opposite to the first surface 1411 and a side surface 1413 connecting the first surface 1411 and the second surface 1412. The first surface 1411 is adjacent to the circuit board 11. The first electrode 142 extends from the second surface 1412 of the piezoelectric layer 141 along the side surface 1413 of the piezoelectric layer 141 to the first surface 1411 of the piezoelectric layer 141. The second electrode 143 extends from the first surface 1411 of the piezoelectric layer 141 along the side surface 1413 of the piezoelectric layer 141 to the second surface 1412 of the piezoelectric layer 141. In another embodiment, the second electrode 143 may be formed only on the first surface 1411 of the piezoelectric layer 141 and spaced apart from the first electrode 142.

The first electrode 142 is electrically connected to the first connecting pad 112 by the ICF 12. The second electrode 143 is electrically connected to the second connecting pad 113 by the ICAL 13. When the touch surface 21 above the tactile feedback modules 10 of the touch device 100 is touched, a first voltage is applied to the first electrode 142 by the circuit board 11 and a second voltage, which is different from the first voltage, is applied to the second electrode 143 by the circuit board 11. The piezoelectric layer 141 generates vibration in accordance with a voltage difference between the first voltage and the second voltage.

The first electrode 142 is electrically connected to the first connecting pad 112 by the ICF 12, and the second electrode 143 is electrically connected to the second connecting pad 113 by the ICAL 13. When a high voltage (for example, in a range from 2000V to 3000V) is applied to the tactile feedback module 10, arcing can be avoided, thereby ensuring that the piezoelectric unit 14 can operate normally and provide good tactile feedback.

In one embodiment, the ICF 12 and the ICAL 13 include rod-type conductive particles 161. The conductive particles 161 are rod-type $TiO_2$ particles with a diameter of 5 μm to 10 μm and coated by copper (Cu).

In one embodiment, the rod-type $TiO_2$ particles are synthesized by hydrolyzing titanium tetraisopropoxide, and then are coated by Cu to form the rod-type conductive particles 161. The rod-type conductive particles 161 cross each other to form dendritic structures. The intersecting dendritic structures formed by the rod-type conductive particles 161 is advantageous in avoiding the arcing at a high voltage (for example, greater than 2000 V).

In another embodiment, the ICF 12 and the ICAL 13 further include sphere-type conductive particles 162. The conductive particles 162 are particles of sphere-type resin which have a diameter of 20 μm to 40 μm and which are coated by nickel (Ni). By controlling an amount of the sphere-type conductive particles 162 added, a thickness of the ICF 12 and the ICAL 13 can be adjusted, thereby adjusting an overall thickness of the tactile feedback module 10.

Referring to FIG. 2, the ICF 12 and the ICAL 13 further include an epoxy adhesive 163. In one embodiment, the rod-type conductive particles 161, the sphere-type conductive particles 162, and the epoxy adhesive 163 are mixed and stirred by a wet chemical method. The mixture is screen-printed on a base film and then cured by using ultraviolet light having a wavelength of 365 nm, for 0.5 second to 1 second, to form a film-type isotropic conductive adhesive (FTICA 16). The ICF 12 and the ICAL 13 are prepared. The base film may be PET.

Referring to FIG. 2, the insulating adhesive layer 15 completely fills gaps between the first connecting pad 112 and the second connecting pad 113, any gaps between the ICF 12 and the ICAL 13, and any gaps between the first electrode 142 and the second electrode 143. In one embodiment, the insulating adhesive layer 15 may be a film-type non-conductive adhesive (FTNCA 17).

The insulating adhesive layer 15 insulates the first connecting pad 112 from the second connecting pad 113, and insulates the ICF 12 from the ICAL 13. It also insulates the first electrode 142 from the second electrode 143. Even at a high potential (for example, a voltage in a range from 2000V to 3000V) between the first connecting pad 112 and the second connecting pad 113, and between the first electrode 142 and the second electrode 143, there is no arcing or electrical conduction.

Referring to FIG. 2, the first electrode 142 extends on the first surface 1411 of the piezoelectric layer 141 beyond the ICF 12. The second electrode 143 extends from the first surface 1411 of the piezoelectric layer 141 through the thickness of the piezoelectric layer 141 to the second surface 1412 of the piezoelectric layer 141.

FIG. 3 shows the piezoelectric unit 14 in FIG. 2. Referring to FIG. 3, on the second surface 1412 of the piezoelectric layer 141, the first electrode 142 and the second electrode 143 extend in a first direction D1 and are spaced apart from each other by a first gap 144. The extension of the second electrode 143 in the first direction D1 is greater than the extension distance of the first electrode 142 in the first direction D1. Two opposite edges of the second surface 1412 of the piezoelectric layer 141 in the second direction D2 are not covered by the first electrode 142 and the second electrode 143. The first direction D1 intersects with the second direction D2.

In an embodiment, the first direction D1 and the second direction D2 are orthogonal. In other embodiments, the first direction D1 may intersect the second direction D2 at angles that are not right angles.

Figure 4:
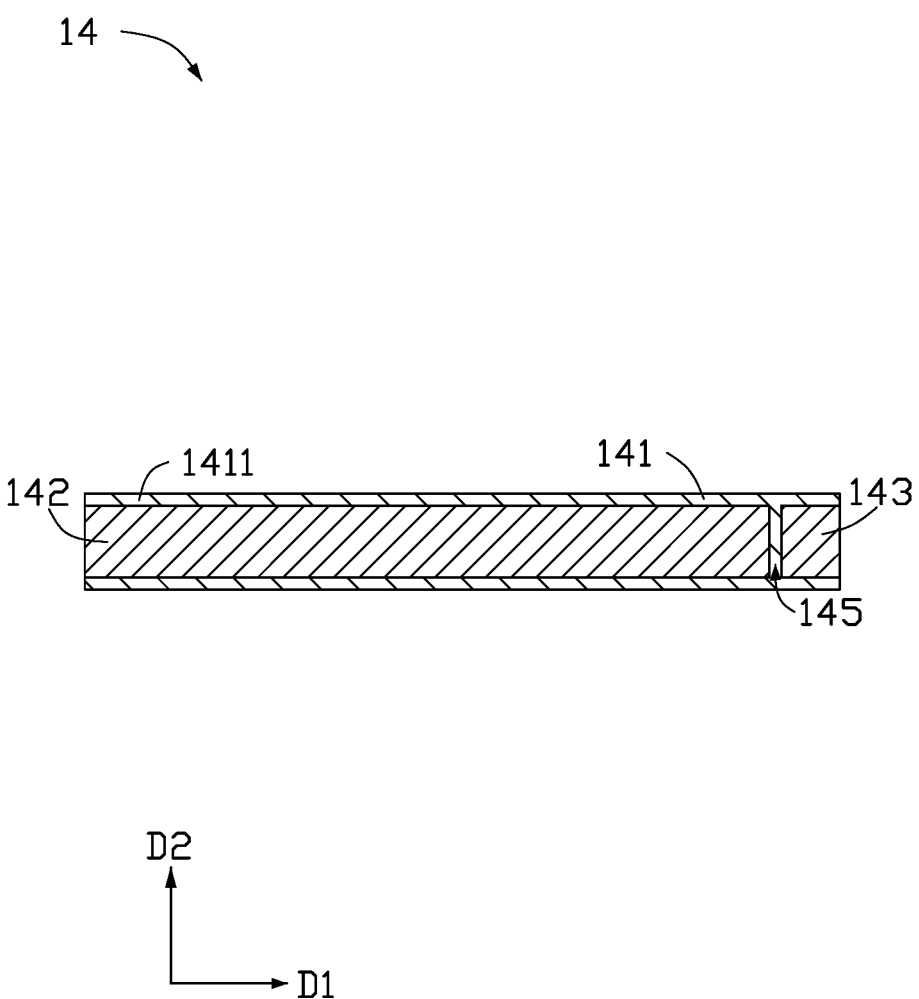
FIG. 4 is a bottom planar view of the piezoelectric unit in FIG. 3.

FIG. 4 shows the piezoelectric unit 14 in FIG. 2. Referring to FIG. 4, on the first surface 1411 of the piezoelectric layer 141, the first electrode 142 and the second electrode 143 extend in the first direction D1 and are spaced apart by a second gap 145. The first electrode 142 extends in the first direction D1. The extension distance of the first electrode 142 in the first direction D1 is greater than the extension of the second electrode 143 in the first direction D1. Two opposite edges of the first surface 1411 of the piezoelectric layer 141 in the second direction D2 are not covered by the first electrode 142 and the second electrode 143.

In one embodiment, a distance between the two edges of the piezoelectric layer 141 not covered by the first electrode 142 in the second direction D2 and a distance between the two edges of the piezoelectric layer 141 not covered by the second electrode 143 in the same direction are both for example 0.5 mm. The width of the first gap 144 in the first direction D1 is the same as the width of the second gap 145 in the same direction.

In one embodiment, a width of the piezoelectric layer 141 in the second direction D2 is 11 mm, and a width of the piezoelectric layer 141 in the first direction D1 is 32 mm. A thickness of the piezoelectric layer 141 is 0.2 mm. The first electrode 142 and the second electrode 143 both have a thickness of 0.005 mm.

In one embodiment, the piezoelectric layer 141 may be made of perovskite lead zirconate titanate (PZT), which has an excellent positive or negative piezoelectric effect and high mechanical properties. The material of the first electrode 142 and the second electrode 143 may be a metal, such as copper or silver, or may be a metal alloy, such as a copper-nickel alloy, or the like.

In one embodiment, the circuit board 11 is a metal core printed circuit board (MCPCB). The substrate 111 is made of a metal having a good heat conduction, such as stainless steel 304 (SUS304), to improve heat dissipation of the circuit board 11.

In one embodiment, a material of the first connecting pad 112 and the second connecting pad 113 may be metal, such as copper, silver, or metal alloy, such as a copper-nickel alloy or the like. In other embodiments, the material of the first connecting pad 112 and the second connecting pad 113 may be other conductive materials.

Figure 5:
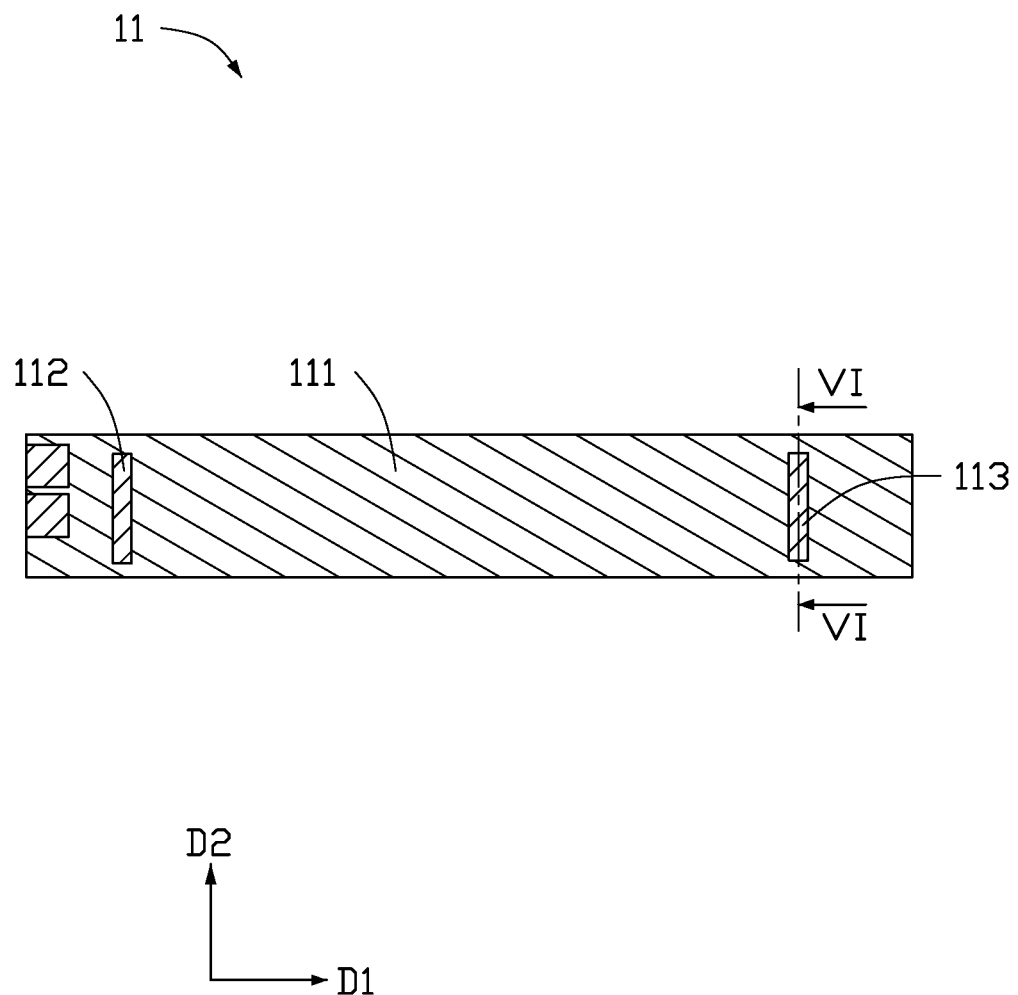
FIG. 5 is a top planar view of a circuit board in the module of FIG. 2.

FIG. 5 shows the circuit board in FIG. 2. Referring to FIG. 5, in the circuit board 11, the first connecting pads 112 and the second connecting pads 113 are spaced from each other in the first direction D1. The first connecting pad 112 has a rectangular strip shape extending in the second direction D2, and the second connecting pad 113 has a rectangular strip shape extending in the second direction D2.

In one embodiment, a length of the substrate 111 in the first direction D1 is 60 mm. A length of the first connecting pad 112 extending in the second direction D2 is 11 mm. A length of the second connecting pad 113 extending in the second direction D2 is 11 mm. Along the first direction D1, the first connecting pad 112 and the second connecting pad 113 are both 32 mm wide. Along the second direction D2, there is a minimum distance of 2 mm from ends of the first connecting pad 112 to the edge of the substrate 111 and the same minimum distance from ends of the second connecting pad 113 to the edge of the substrate 111. In other embodiments, the layouts of the substrate 111, the first connecting pad 112, and the second connecting pad 113 may be adjusted.

Figure 6:
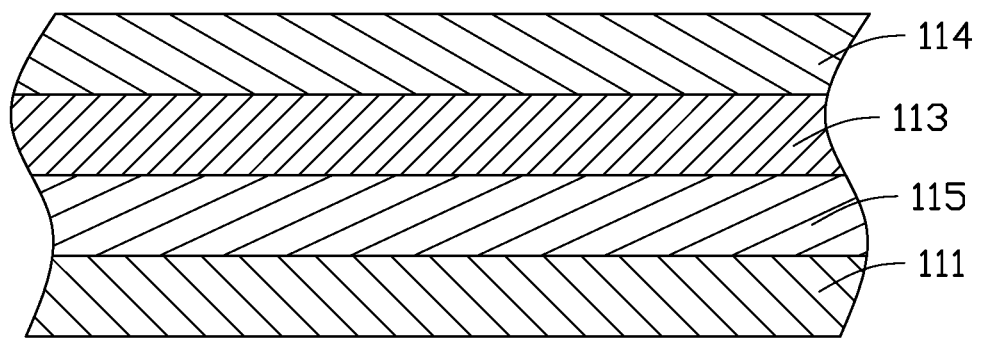
FIG. 6 is a cross-sectional view along line VI-VI of FIG. 5.

Referring to FIG. 6, the circuit board 11 further includes an adhesive layer 115 between the second connecting pad 113 and the substrate 111, and a solder mask 114 on a side of the second connecting pad 113 away from the substrate 111. An adhesive layer 115 is between the first connecting pad 112 and the substrate 111, and a solder resist layer 114 is on a side of the first connecting pad 112 away from the substrate 111.

In one embodiment, a thickness of the substrate 111 is 400 µm. A thickness of the adhesive layer 115 is less than 20 µm. The first connecting pad 112 and the second connecting pad 113 have same thickness of 12 µm. A thickness of the solder resist layer 114 is 25 µm. In other embodiments, the thicknesses of each layer of the circuit board 11 may be adjusted.

In one embodiment, in the tactile feedback module 10, a thickness of the piezoelectric unit 14 is 200 µm. The thickness of the ICF 12 and the ICAL 13 is 22 µm. A thickness of the circuit board 11 is 457 µm.

Referring to FIG. 7, a flowchart of a method in one embodiment is disclosed. The method is provided by way of embodiment, as there are a variety of ways to carry out the method. The method described below can be carried out using the configurations illustrated in FIG. 2 for example, and various elements of these figures are referenced in explaining the method. Each block shown in FIG. 7 represents one or more processes, methods, or subroutines, carried out in the method. Additionally, the illustrated order of blocks is by example only and the order of the blocks can change. The method can begin at Block S1.

Block S1: a circuit board 11 is provided, and the circuit board 11 includes a first connecting pad 112 and a second connecting pad 113 spaced apart from the first connecting pad 112, and an uncured film-type isotropic conductive adhesive 16 is formed on the first connecting pad 112 and the second connecting pad 113.

Figure 8:
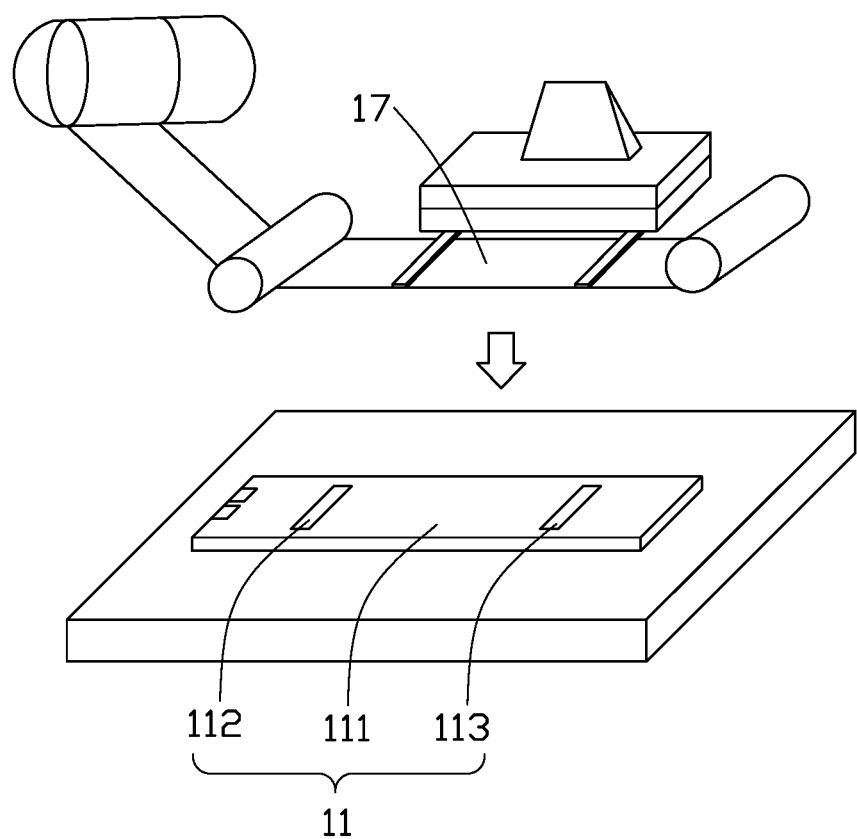
FIG. 8 and FIG. 9 are schematic diagrams showing a first step of a method for making the tactile feedback module.

Referring to FIG. 8, before the uncured film-type isotropic conductive adhesive 16 is formed on the first connecting pad 112 and the second connecting pad 113, the Block S1 further includes forming an uncured film-type non-conductive adhesive 17 between the first connecting pad 112 and the second connecting pad 113. For example, an uncured film-type non-conductive adhesive 17 is laminated on the circuit board 11, and an uncured film-type non-conductive adhesive 17 is formed between the first connecting pad 112 and the second connecting pad 113.

Figure 9:
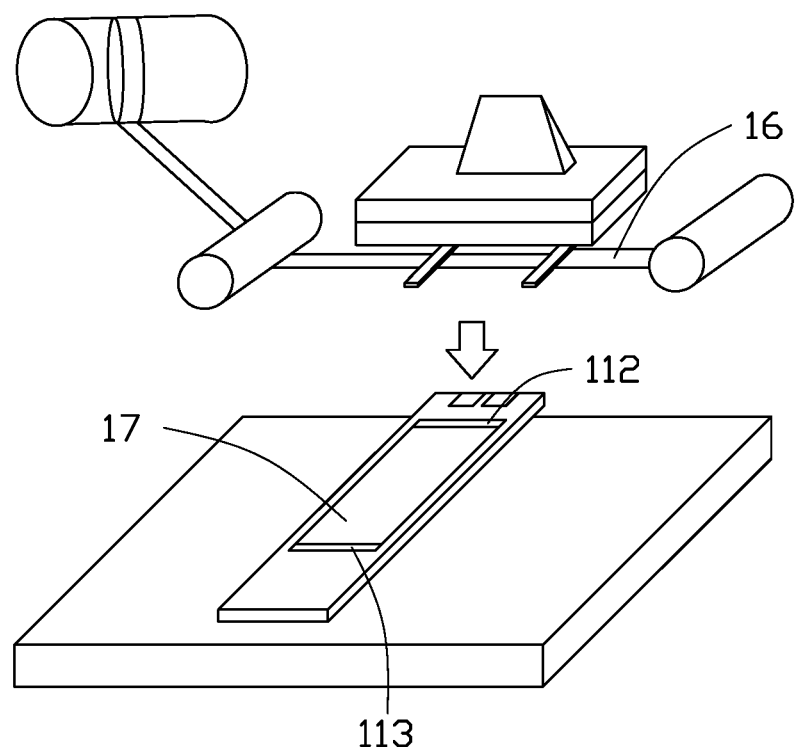

Referring to FIG. 9, after laminating the uncured film-type non-conductive adhesive 17 onto the circuit board 11, the circuit board 11 with the film-type non-conductive adhesive 17 is rotated by 90 degrees, and then the cured film-type isotropic conductive adhesive 16 is laminated to the first connecting pad 112 and the second connecting pad 113.

Block S2: the piezoelectric unit 14 is provided, and the piezoelectric unit 14 is laminated on the circuit board 11.

Figure 10:
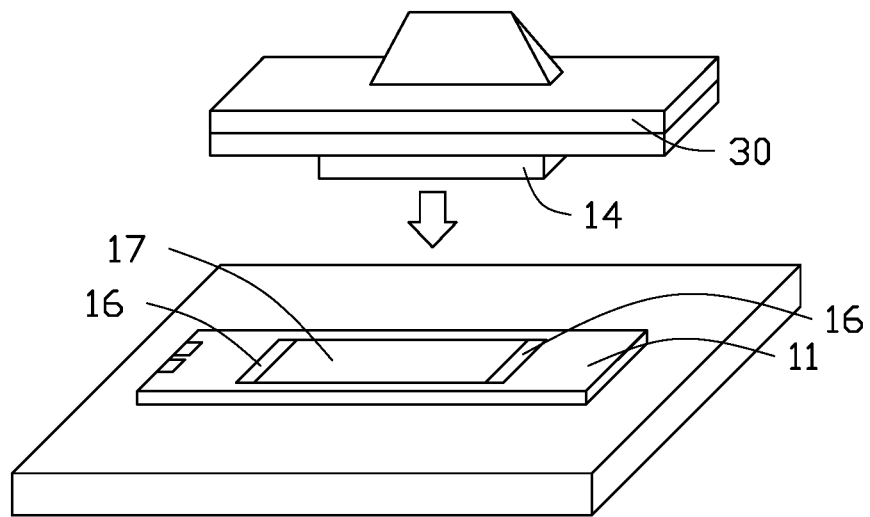
FIG. 10 is a schematic diagram showing a second step of a method for making the tactile feedback module.

Referring to FIG. 10, the piezoelectric unit 14 is vacuum-adsorbed into a fixture 30, and then the piezoelectric unit 14 is laminated to the circuit board 11.

Block S3: the cured film-type isotropic conductive adhesive 16 forms a ICF 12 and a ICAL 13, so that the first electrode 142 is electrically connected to the first connecting pad 112 by the ICF 12, and the second electrode 143 is electrically connected to the second connecting pad 113 by the ICAL 13.

Figure 11:
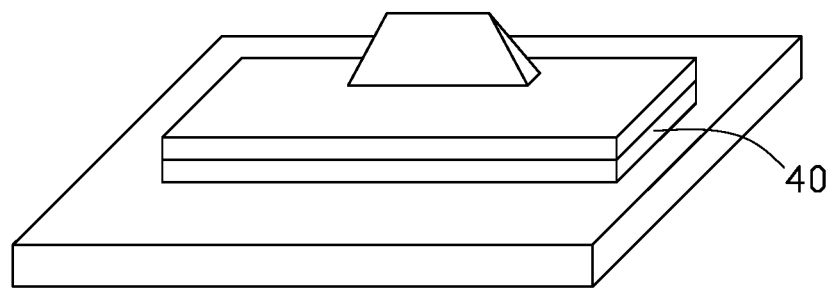
FIG. 11 and FIG. 12 are schematic diagrams showing a third step of a method for making the tactile feedback module.
Figure 12:
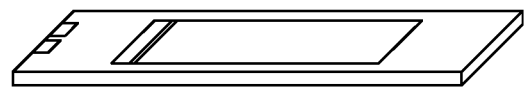

Referring to FIG. 11, a sample 40 formed by laminating the piezoelectric unit 14, the uncured film-type isotropic conductive adhesive 16, the uncured film-type non-conductive adhesive 17, and the circuit board 11 is at 120° C. The film is prepared for 3 minutes to cure the film-type isotropic conductive adhesive 16 to form the ICF 12 and the ICAL 13, so that the first electrode 142 is electrically connected to the first connecting pad 112 by the ICF 12, and the second electrode 143 is electrically connected to the second connecting pad 113 by the ICAL 13. And then, the film-type non-conductive adhesive 17 is cured to form the insulating paste layer 15. Finally, as shown in FIG. 12, the tactile feedback module 10 is obtained.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A tactile feedback module, comprising:
a circuit board, the circuit board comprising a first connecting pad and a second connecting pad spaced from the first connecting pad;
a first isotropic conductive adhesive layer on the first connecting pad;
a second isotropic conductive adhesive layer on the second connecting pad; and
a piezoelectric unit, the piezoelectric unit comprising:
a piezoelectric layer having a first surface being adjacent to the circuit board, a second surface opposite to the first surface and a side surface connecting the first surface and the second surface;
a first electrode extending from the second surface of the piezoelectric layer along the side surface of the piezoelectric layer to the first surface of the piezoelectric layer, and electrically connected to the first connecting pad by the first isotropic conductive adhesive layer; and
a second electrode, at least on the first surface of the piezoelectric layer and insulated and spaced apart from the first electrode, and the second electrode electrically connected to the second connecting pad by the second isotropic conductive adhesive layer;
wherein a first voltage is applied to the first electrode by the circuit board and a second voltage different from the first voltage is applied to the second electrode by the circuit board, and the piezoelectric layer generates a tactile feedback based on a voltage difference between the first voltage and the second voltage.

2. The tactile feedback module according to claim 1, further comprising an insulating adhesive layer, wherein the insulating adhesive layer completely fills an gap between the first connecting pad and the second connecting pad, an gap between the first isotropic conductive paste layer and the second isotropic conductive paste layer and an gap between the first electrode and the second electrode.

3. The tactile feedback module according to claim 2, wherein both the first isotropic conductive adhesive layer and the second isotropic conductive adhesive layer comprise rod-type first conductive particles.

4. The tactile feedback module according to claim 3, wherein both the first isotropic conductive adhesive layer and the second isotropic conductive adhesive layer further comprise sphere-type second conductive particles.

5. The tactile feedback module according to claim 1, wherein the first electrode extends on the first surface of the piezoelectric layer and beyond the first isotropic conductive adhesive layer.

6. The tactile feedback module according to claim 1, wherein the second electrode extends from the first surface of the piezoelectric layer along the side surface of the piezoelectric layer to the second surface of the piezoelectric layer.

7. A touch device, comprising:
- a cover defining a touch surface for inputting touch operations, and a plurality of tactile feedback modules on a side of the cover away from the touch surface, and each of the plurality of tactile feedback modules comprising:
- a circuit board, the circuit board comprising a first connecting pad and a second connecting pad spaced from the first connecting pad;
- a first isotropic conductive adhesive layer on the first connecting pad;
- a second isotropic conductive adhesive layer on the second connecting pad; and
- a piezoelectric unit, the piezoelectric unit comprising:
- a piezoelectric layer having a first surface being adjacent to the circuit board, a second surface opposite to the first surface and a side surface connecting the first surface and the second surface;
- a first electrode extending from the second surface of the piezoelectric layer along the side surface of the piezoelectric layer to the first surface of the piezoelectric layer, and electrically connected to the first connecting pad by the first isotropic conductive adhesive layer; and
- a second electrode, at least on the first surface of the piezoelectric layer, and insulated and spaced apart from the first electrode, and the second electrode electrically connected to the second connecting pad by the second isotropic conductive adhesive layer;
- wherein a first voltage is applied to the first electrode by the circuit board and a second voltage different from the first voltage is applied to the second electrode by the circuit board, and the piezoelectric layer generates a tactile feedback based on a voltage difference between the first voltage and the second voltage.

8. The touch device according to claim 7, further comprising an insulating adhesive layer, wherein the insulating adhesive layer completely fills an gap between the first connecting pad and the second connecting pad, an gap between the first isotropic conductive paste layer and the second isotropic conductive paste layer and an gap between the first electrode and the second electrode.

9. The touch device according to claim 8, wherein both the first isotropic conductive adhesive layer and the second isotropic conductive adhesive layer comprise rod-type first conductive particles.

10. The touch device according to claim 9, wherein both the first isotropic conductive adhesive layer and the second isotropic conductive adhesive layer further comprise sphere-type second conductive particles.

11. The touch device according to claim 7, wherein the first electrode extends on the first surface of the piezoelectric layer and beyond the first isotropic conductive adhesive layer.

12. The touch device according to claim 7, wherein the second electrode extends from the first surface of the piezoelectric layer along the side surface of the piezoelectric layer to the second surface of the piezoelectric layer.

13. A method for making a tactile feedback module, comprising:
- Block S1: providing a circuit board, wherein the circuit board comprises a first connecting pad and a second connecting pad spaced apart from the first connecting pad, and an uncured film-type isotropic conductive adhesive is formed on the first connecting pad and the second connecting pad;
- Block S2: providing a piezoelectric unit and laminating the piezoelectric unit to the circuit board, wherein the piezoelectric unit comprises a piezoelectric layer, a first electrode and a second electrode, the piezoelectric layer has a first surface, a second surface opposite to the first surface and a side surface connecting the first surface and the second surface, the first electrode extends from the second surface of the piezoelectric layer along the side surface of the piezoelectric layer to the first surface of the piezoelectric layer, and the second electrode is at least on the first surface of the piezoelectric layer and spaced apart from the first electrode;
- Block S3: curing the film-type isotropic conductive adhesive to form a first isotropic conductive adhesive layer and a second isotropic conductive adhesive layer, wherein the first electrode is electrically connected to the first connecting pad by the first isotropic conductive adhesive layer, and the second electrode is electrically connected to the second connecting pad by the second isotropic conductive adhesive layer.

14. The method according to claim 13, before the uncured film-type isotropic conductive adhesive is formed on the first connecting pad and the second connecting pad, wherein in the Block S1, an uncured film-type non-conductive adhesive is formed between the first connecting pad and the second connecting pad.

15. The method according to claim 14, wherein in the Block S3, when the film-type isotropic conductive adhesive is cured, the film-type non-conductive adhesive is cured at the same time.

\* \* \* \* \*

UNITED STATES PATENT AND TRADEMARK OFFICE
CERTIFICATE OF CORRECTION

PATENT NO. : 10,642,363 B1
APPLICATION NO. : 16/369065
DATED : May 5, 2020
INVENTOR(S) : Tu et al.

It is certified that error appears in the above-identified patent and that said Letters Patent is hereby corrected as shown below:

On the Title Page

Please replace item (73) regarding "Assignees" with the following:
(73) Interface Technology (ChengDu) Co., Ltd., Chengdu (CN);
INTERFACE OPTOELECTRONICS (SHENZHEN) CO., LTD., Shenzhen (CN);
GENERAL INTERFACE SOLUTION LIMITED, Zhunan (TW)

Signed and Sealed this
Eighth Day of December, 2020

Andrei Iancu
*Director of the United States Patent and Trademark Office*